United States Patent
Kim

(10) Patent No.: US 7,299,028 B2
(45) Date of Patent: Nov. 20, 2007

(54) LOW POWER, LOW NOISE FIGURE, LATCH DRIVER CIRCUIT

(75) Inventor: Helen Kim, Sudbury, MA (US)

(73) Assignee: United States of America as represented by the Secretary of the Air Force, Washington, DC (US)

( * ) Notice: Subject to any disclaimer, the term of this patent is extended or adjusted under 35 U.S.C. 154(b) by 518 days.

(21) Appl. No.: 11/041,183

(22) Filed: Jan. 21, 2005

(65) Prior Publication Data

US 2006/0166640 A1      Jul. 27, 2006

(51) Int. Cl.
*H04B 1/16*     (2006.01)
(52) U.S. Cl. .................... 455/318; 455/326; 455/333
(58) Field of Classification Search ............... None
See application file for complete search history.

(56) References Cited

U.S. PATENT DOCUMENTS

| | | | |
|---|---|---|---|
| 4,237,387 A | 12/1980 | Devendorf et al. | |
| 4,468,784 A * | 8/1984 | Jagnow et al. | 375/150 |
| 5,438,693 A * | 8/1995 | Cox | 455/333 |
| 6,785,530 B2 * | 8/2004 | Hatcher et al. | 455/326 |

OTHER PUBLICATIONS

Alireza Zolfaghari and Behzad Razavi; A Low-Power 2.4-GHz Transmitter/Receiver CMOS IC; IEEE Journal of Solid-State Circuits, vol. 38, No. 2 Feb. 2003.

* cited by examiner

*Primary Examiner*—Thanh Cong Le
(74) *Attorney, Agent, or Firm*—AFMCLO/JAZ; Robert V. Klouzinski

(57) ABSTRACT

A latch driver circuit is provided as a local oscillator driver for driving a passive mixer of an RF receiver. The driver circuit includes a differential amplifier stage coupled to a supply and a biasing circuit. The amplifier stage is operative to receive and process first and second input signals from a local oscillator for providing first and second amplified signals. The driver circuit further includes a latch stage coupled to the differential amplifier stage, which is operative to receive and process the first and second amplified signals for providing latched versions thereof. A filtering stage of the latch driver circuit is operative to receive and filter the latched versions of the first and second amplified signals for providing first and second mixer signals. Each of the first and second mixer signals includes signal content associated with a fundamental frequency particularly tuned for driving the passive mixer circuit.

9 Claims, 5 Drawing Sheets

LOW POWER, LOW NOISE FIGURE, LATCH DRIVER CIRCUIT

CROSS REFERENCE TO RELATED APPLICATIONS

Not Applicable.

STATEMENT REGARDING FEDERALLY SPONSORED RESEARCH

Not Applicable.

FIELD OF THE INVENTION

The present invention relates generally to radio frequency (RF) receivers and, more particularly, to a latch driver circuit employed as a local oscillator driver for driving a passive mixer of an RF receiver.

BACKGROUND OF THE INVENTION

As is known, a passive mixer is often used in a linear RF receiver system to meet stringent linearity and noise requirements. An example of a passive mixer is a double balanced resistive Field Effect Transistor (FET) mixer, where all the ports are operated differentially. In the FET mixer, local oscillator (LO) signals are applied to the gates, RF signals are applied to sources (or drains) and intermediate frequency (IF) signals are taken from the drains (or sources). In order to achieve the high linearity and low noise requirements, a relatively large LO signal is required, which LO signal is typically greater than 10 dBm.

The resistive FET mixer works by changing the resistance between gate to source from low to high resistance. The high intercept point ($IP_3$) of the FET mixer is achieved by operating the FETs of the FET mixer at a linear region and completely switching the gates on and off. Therefore, it is important to properly bias the FETs of the FET mixer by apply a relatively large LO signal to the FET mixer. The large LO signal applied to the FET mixer is also important for achieving a low conversion loss and thus a low noise figure. A typical LO signal level that is required to achieve an $IP_3$ of greater than 15 dBm is over 10 dBm. In order to deliver 10 dBm of power in a 50 ohm system, for example, a peak-to-peak current of 40 $mA_{p-p}$ or equivalently peak-to-peak voltage of 2 $V_{p-p}$ is required. Accordingly, the LO signal should be amplified from 0 dBm, which is the typical output power level of the LO, to 10 dBm for properly driving the FET mixer. In order to amplify the LO signal from 0 dBm to 10 dBm, however, requires that the LO signal be passed through a linear amplifier prior to being provided to the FET mixer.

One drawback or disadvantage to using a linear amplifier to boost the power level of the LO signal from 0 dBm to 10 dBm and to provide the minimum peak-to-peak current of 40 $mA_{p-p}$ is the excessive power required by the linear amplifier itself. In this example, a minimum of 20 mA of bias current is needed to operate the linear amplifier. This power required to operate the linear amplifier (e.g., 20 mA) is a substantial portion of the overall power dissipation of a typical RF receiver.

It would, therefore, be desirable to overcome the aforesaid and other disadvantages.

SUMMARY OF THE INVENTION

A driver circuit that is operative to drive a passive mixer located in a radio-frequency (RF) receiver is set forth. The driver circuit includes a power supply and a biasing circuit that is operative to enable and/or drive elements of the driver circuit. A differential amplifier stage of the driver circuit is coupled to the supply and to the biasing circuit. The differential amplifier stage is adapted to receive first and second input signals from a local oscillator and to process the first and second input signals for providing first and second amplified signals as an output. A latch stage of the driver circuit is coupled to the differential amplifier stage, supply and biasing circuit. The latch stage is adapted to receive and process the first and second amplified signals, as provided by the differential amplifier stage, for providing latched versions of the first and second amplified signals. A filtering stage of the driver circuit is coupled to the latch stage. The filtering stage is adapted to receive and filter the latched versions of the first and second amplified signals for providing first and second filtered signals, wherein each of the first and second filtered signals includes predetermined signal content associated with at least one predetermined frequency range.

In one aspect, the filtering stage of the driver circuit includes a band-pass filter adapted to control the at least one predetermined frequency range to include a fundamental frequency range. In one example, the fundamental frequency range ranges from approximately 8 GHz to approximately 9.2 GHz. Furthermore, one exemplary circuit topology of the filtering stage may include a tank circuit.

In an aspect, the driver circuit may further include a signal conditioning stage coupled to the differential amplifier stage. The signal conditioning stage is adapted to provide preliminary filtering to the first and second amplified signals for removing predetermined harmonic signal content from the first and second amplified signals while minimizing any signal amplitude degradation to the first and second amplified signals. In one aspect, the signal conditioning stage may include a first inductor and capacitor pair coupled in parallel and having first and second terminals. The first terminal of the first inductor and capacitor pair may be coupled to the supply and the second terminal of the first inductor and capacitor pair may be coupled to a first terminal of a first resistor. A second terminal of the first resistor may be coupled to communicate with the first amplified signal.

In another aspect, the signal conditioning stage may further include a second inductor and capacitor pair coupled in parallel and having first and second terminals. The first terminal of the second inductor and capacitor pair may be coupled to the supply and the second terminal of the second inductor and capacitor pair may be coupled to a first terminal of a second resistor. A second terminal of the second resistor may be coupled to communicate with the second amplified signal.

In another aspect, the signal conditioning stage may include a first inductor and capacitor pair coupled in parallel and having first and second terminals. The first terminal of the first inductor and capacitor pair may be coupled to the supply and the second terminal of the first inductor and capacitor pair may be coupled a first drain terminal of a first transistor. The first transistor may further include a first gate terminal that may be coupled to a gate biasing source and a first source terminal that may be coupled to communicate with the first amplified signal.

The signal conditioning stage may further include a second inductor and capacitor pair coupled in parallel and having first and second terminals. The first terminal of the second inductor and capacitor pair may be coupled to the supply and the second terminal of the second inductor and capacitor pair may be coupled to a first drain terminal of a second transistor. The second transistor may further include a first gate terminal that may be coupled to the gate biasing source and a first source terminal that may be coupled to communicate with the second amplified signal.

BRIEF DESCRIPTION OF THE DRAWINGS

The invention will be more fully understood from the following detailed description taken in conjunction with the accompanying drawings, in which.

DETAILED DESCRIPTION OF THE INVENTION

The present invention provides a relatively low power, low noise figure, latch driver circuit. The latch driver circuit may be employed to drive a number of devices and/or circuits, such as a passive mixer of an RF receiver, which may be incorporated in a radar system, wire-less telecommunication device and the like. When the latch driver circuit is incorporated in a radar system, such as a phased array radar systems which itself may incorporate a number of RF receivers, the overall power consumption and noise figure of the radar system may be significantly reduced, as will be described in further detail below.

Figure 1:
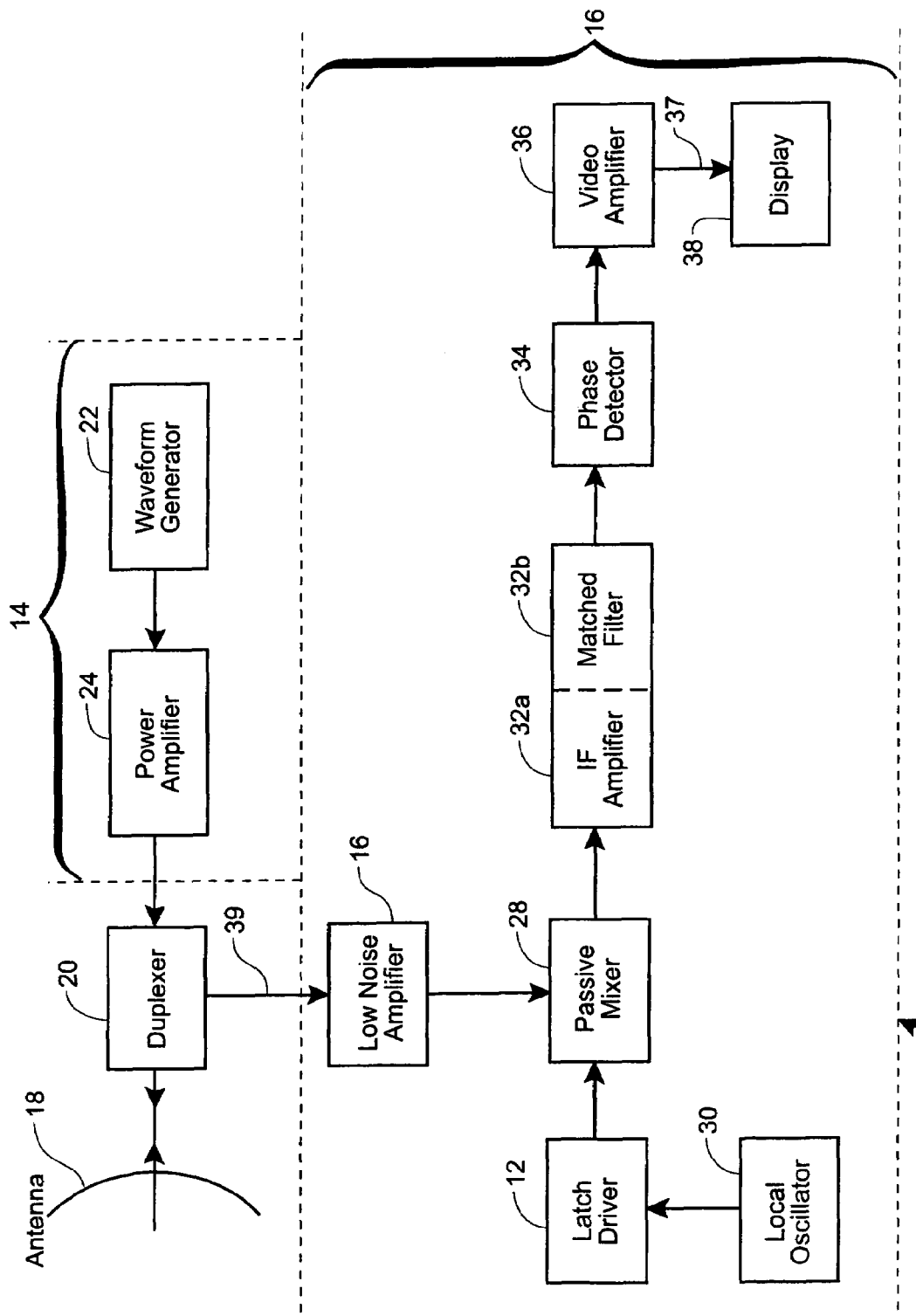
FIG. 1 is a high level functional block diagram of a radar system incorporating an RF receiver having the latch driver circuit in accordance with the present invention.

Referring now to FIG. 1, in an exemplary embodiment, shown is a high level functional block diagram of a radar system 10 incorporating the latch driver circuit 12 of the present invention. The radar system 10 includes an RF transmitter portion 14 and an RF receiver portion 16. The RF transmitter and receiver portions 14, 16 of the radar system 10 are both coupled to a common antenna 18, via a duplexer 20. The duplexer 20 operates as a high speed switch for rapidly multiplexing between the RF transmitter and the RF receiver portions 14, 16 of the radar system 10 to couple the RF transmitter portion 14 to the antenna 18 during the energy transmission stage of operation of the radar system 10 and to couple the RF receiver portion 16 to the antenna 18 during the energy or echo receive stage of operation of the radar system 10.

In the exemplary embodiment, the RF transmitter portion 14 of the radar system 10 includes a waveform generator 22 coupled to a power amplifier 24. The waveform generator 22 is adapted for generating a repetitive train of short pulses that are subsequently provided to the antenna 18, via the power amplifier 22 and duplexer 20, for radiating the train of pulses out into space. The RF receiver portion 16 of the radar system 10 includes a low noise amplifier 26 coupled to the duplexer 20 as well as to a passive mixer 28 (e.g., mixer that does not have any gain). The passive mixer 28 is coupled to a latch driver 12, which driver 12 is coupled to a local oscillator 30. The passive mixer 28 is further coupled to an intermediate-frequency (IF) amplifier and filtering portion 32a, 32b, which is coupled to a phase detector 34. The phase detector 34 is coupled to a video amplifier 36, which is finally coupled to a display 38.

Generally in this arrangement of the radar system 10, RF energy or echos (collectively referred to herein as "RF signal") sensed by the antenna 18 is sent to the RF receiver portion 16 of the radar system 10, via the duplexer 20. The RF receiver portion 16 serves to separate the desired RF signal from the ever-present noise and other interfering signals, as well as to amplify the RF signal sufficiently to actuate the display 38. At microwave frequencies, the noise at the RF receiver output 37 is typically that generated by the RF receiver portion 16 itself rather than external noise that enters the RF receiver 16, via the antenna 18. The input stage 39 of the RF receiver 16 should not introduce excessive noise, which would interfere with the RF signal to be detected.

The passive mixer 28 operates to translate the receiver RF signal to an IF signal by mixing the RF signal with a signal provided by the LO (e.g., LO signal), which is received at the mixer 28, via the low power, low noise figure, latch driver circuit 12 of the present invention, as will be described in further detail below in connection with FIG. 2. In FIG. 1, the gain of the IF amplifier 32a results in an increase in the IF signal level. The IF amplifier 32a also includes the function of the matched filter 32b, which operates to maximize the output signal-to-noise ratio. Maximizing the signal-to-noise ratio at the output of the matched filter 32b maximizes the delectability of the IF signal. The phase detector 34 receives and processes the IF signal to extract the Doppler frequency by comparison with a reference signal at the transmitted frequency. The video amplifier 36 raises the signal power of the extracted Doppler frequency to a level suitable for actuating the display 38. A threshold may be established at the output of the video amplifier 36 to permit the detection decision to be made. If the output of the video amplifier 36 crosses the threshold, a target (not shown) is said to be present and such target is illustrated on the display 38.

Figure 2:
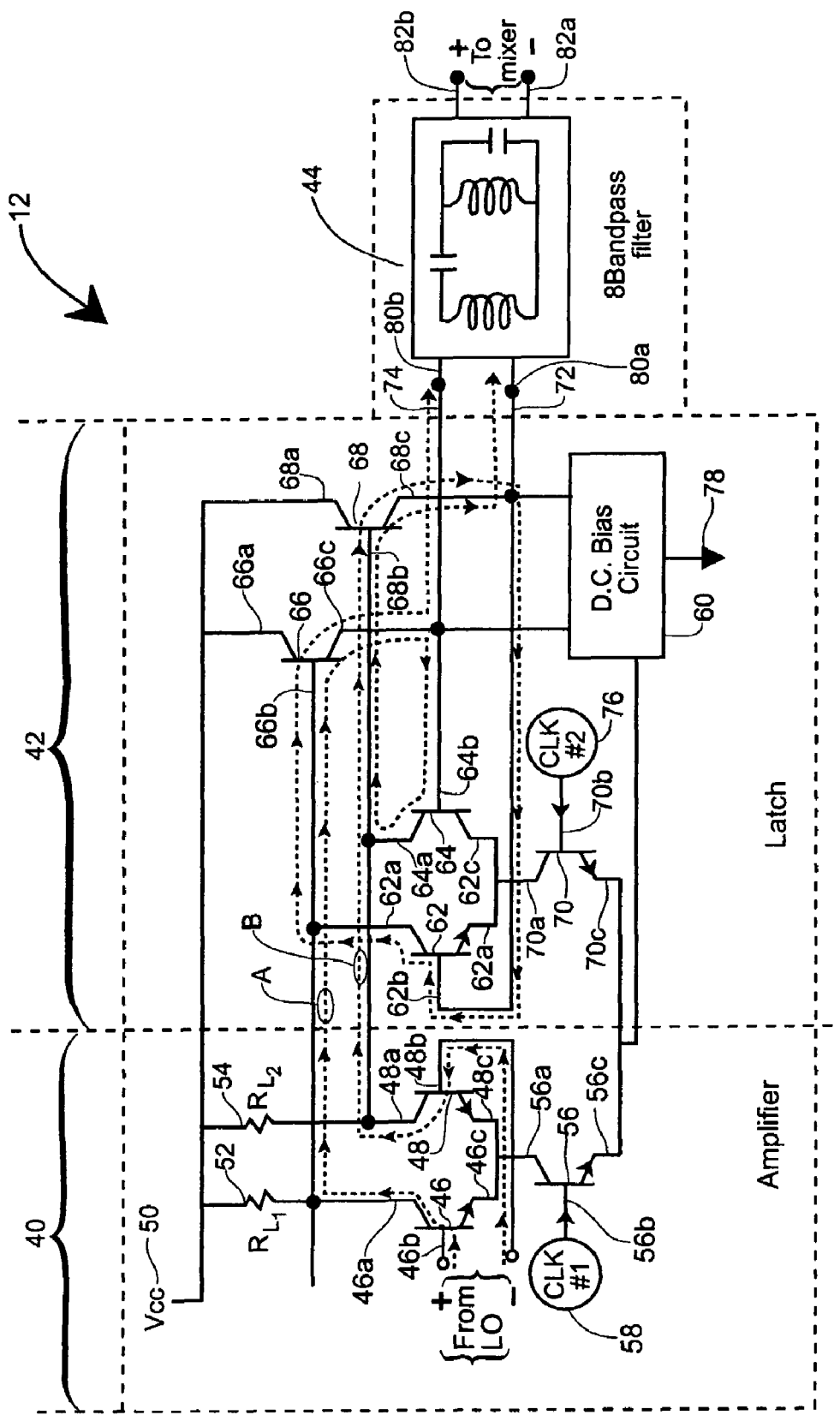
FIG. 2 is a circuit diagram of the latch driver circuit which may be incorporated in the RF receiver of FIG. 1.

FIG. 2 shows an exemplary embodiment of the low power, low noise figure latch driver circuit 12 of the present invention. The latch driver circuit 12 includes a differential amplifier stage 40 coupled to a latch stage 42. The latch stage 42 is further coupled to filtering stage 44, which in the exemplary embodiment may include a band-pass filter.

The differential amplifier stage 40 includes first and second transistors 46, 48 which respectively include collector terminals 46a, 48a coupled to a supply 50 (e.g., VCC), via respective first and second load resistors 52, 54. A base terminal 46b, 48b of each of the first and second transistors 46, 48 are respectively coupled to receive a plurality of signals from the local oscillator 30. The first and second transistors 46, 48 each further include an emitter terminal 46c, 48c which is coupled to a collector terminal 56b of a third transistor 56. A base terminal 56b of the third transistor 56 is coupled to receive a plurality of clock signals from a first clock circuit 58. In an embodiment, the first clock circuit 58 is adapted to provide a train of positive pulses at a predetermined frequency to the base terminal 56b of the third transistor 56. The third transistor 56 further includes an emitter terminal 56c, which is coupled to a Direct Current (D.C.) biasing circuit 60.

The latch stage 42 includes fourth, fifth, sixth, seventh and eighth transistors 62, 64, 66, 68, 70, which respectively include collector 62a, 64a, 66a, 68a, 70, base 62b, 64b, 66b, 68b, 70b and emitter 62c, 64c, 66c, 68c, 70c terminals. The collector terminal 62a of the fourth transistor 62 and the base terminal 66b of the sixth transistor 66 are coupled to the collector terminal of the first transistor 46, which serves to provide a first amplified signal to the latch stage 42. Similarly, the collector terminal 64a of the fifth transistor 64 and the base terminal 68b of the seventh transistor 68 are coupled to the collector terminal 48a of the second transistor 48, which serves to provide a second amplified signal to the latch stage 42.

The base terminal 62b of the fourth transistor 62 is coupled to the emitter terminal 68c of the seventh transistor 68 and further serves to provide a first output port 72 for the latch 42 stage of the latch driver circuit 12. In the exemplary embodiment, the first output port 72 communicates a latched, transitioned or otherwise inverted version of the first amplified signal to the filtering stage 44. Similarly, the base terminal 64b of the fifth transistor 64 is coupled to the emitter terminal of the sixth transistor 66 and further serves to provide a second output port 74 for the latch driver stage 42 of the latch driver circuit 12. In the exemplary embodiment, the second output port 74 communicates a latched, transitioned or otherwise inverted version of the second amplified signal to the filtering stage 44.

The emitter terminals 62c, 64c of the respective fourth and fifth transistors 62, 64 are coupled to the collector terminal 70a of the eighth transistor 70. A base terminal 70b of the eighth transistor 70 is coupled to receive a plurality of clock signals from a second clock circuit 76. In an embodiment, the second clock circuit 76 is adapted to provide a train of positive pulses at a predetermined frequency to the base terminal 70b of the eighth transistor 70. The emitter terminal 70c of the eighth transistor 70 is coupled to the D.C. biasing circuit 60. The D.C. biasing circuit 60 is further coupled to the respective emitter terminals 66c, 68c of each of the sixth and seventh transistors 66, 68, as well as to ground. The collector terminals 66a, 68a of each of the respective sixth and seventh transistors 66, 68 are coupled to the supply 50.

The latch driver circuit 12 of the present invention further includes the filtering stage 44a having input ports 80a, 80b and output ports 82a, 82b. The input ports 80a, 80b of the filter stage 44 are respectively coupled to the first and second output ports 72, 74 of the latch stage 42 and the output ports 82a, 82b of the filtering stage 44 are coupled to the passive mixer 28 (FIG. 1), as will be described in further detail below in connection with FIG. 3.

In the exemplary embodiment, the filtering stage 44 includes a band-pass filter, which is operative to filter higher order harmonic signal content from the latched versions of the first and second amplified signals for providing respective first and second LO signals (e.g., first and second filtered signals, as realized at the output of the filtering stage 44 and as provided to one input port of the mixer 28 (FIG. 1)) having signal content at a predetermined frequency, such as the fundamental frequency of the first and second amplified signals (e.g., GHz range). In an embodiment, the higher order signal content filtered from the latched versions of the first and second amplified signals may include third order harmonics. In other embodiments, the filtering stage 44 can be further tuned to filter fifth and seventh order harmonics from the first and second amplified signals to provide the respective first and second LO signals. It should be understood that the filtering stage 44 may reduce the amplitude of the first and second amplified signals to provide the respective first and second LO signals at the fundamental frequency, and thus, it may be necessary to provide the first and second LO signals to an amplifier (not shown) prior to providing the first and second LO signals to the passive mixer circuit 28 (FIG. 1).

The first and second mixer signals, which have maximum signal content at the fundamental frequency are particularly useful in driving the passive mixer 28 because the passive mixer 28 is specifically tuned to mix the fundamental frequency portion of the LO signal provided by the local oscillator 30 (FIG. 1) with the RF signal provided by the antenna 18 (FIG. 1) to provide an output at the IF. Since the fundamental frequency portion of the LO signal is provided by the latch driver circuit 12 to the passive mixer 28 with a maximum concentration of signal content at the fundamental frequency, the mixer 28 will be mixing the maximum power level LO signal with the RF signal for maximizing the conversion gain of the passive mixer 28. In other words, maximizing the conversion gain of the mixer 28 using the maximum power level LO signal, as provided by the latch driver circuit 12 of the present invention, minimizes conversion losses or noise figure of the passive mixer 28 and permits the mixer 28 to provide an IF output having a relatively greater power level.

In the exemplary embodiment, the latch driver circuit 12 may be categorized as a regenerative circuit, which can deliver a relatively large voltage output while consuming minimal current. The current consumption of the latch driver circuit 12 may be determined as the peak-to-peak voltage divided by the either the first or second load resistor 52, 54 (e.g., $R_{L1}$ or $R_{L2}$). In this example, the latch driver circuit 12 provides differential output signals (e.g., first and second amplified signals) from the collector terminals 46a, 48a of the first and second transistors 46, 48, respectively. Therefore, each of the differential outputs should provide 1 $V_{p-p}$ (or 2 $V_{p-p}$ differential). The first and/or second load resistor, 52, 54, should not be set arbitrarily high to reduce the bias current if the latch driver circuit 12 is to operate at a high frequency. For instance, if the latch driver circuit 12 is to operate at approximately 10 GHz, the RC time constant should be less than 10 GHz.

In one specific example, the first and second load resistors 52, 54 can each include a 300 ohm resistor and a 3.3 mA bias current may be provided to emitters 46c, 48c, 62c, 64c of respective first, second, fourth and fifth transistors 46, 48, 62, 64. Under these operating characteristics, the latch driver circuit 12 can operate to drive the passive mixer 28 (FIG. 1) with approximately 10 to 12 dBm of LO driver output power while only consuming approximately 3.3 mA of bias current (as opposed to a conventional linear amplifier being used to drive the passive mixer 28, which consumes approximately 20 mA of bias current to provide the passive mixer 28 with approximately 10 to 12 dBm of LO driver output power).

During operation of the latch driver circuit 12, the first clock signal provided by the first clock circuit 58 is controlled to turn the amplifier stage 40 on and the second clock signal provided by the second clock circuit 76 is controlled to turn the latch stage 42 off. More precisely, the first clock signal provided by the first clock circuit 58 is controlled to provide a positive voltage value to the base 56b of the third transistor 56 for turning on the third transistor 56 to permit the D.C. bias circuit 60 to provide biasing current to the emitters 46c, 48c of the first and second transistors 46, 48, which enables the first and second transistors 46, 48 to respectively pass positive and negative local oscillator signals from each of their respective bases 46b, 48b to their respective collectors 46c, 48c. Furthermore, current provided by the supply 50 and flowing through the first load resistor 52 combines with the current flowing from the collector 46a of the first transistor 46 to provide the first amplified signal. At the same time, current provided by the supply 50 and flowing through the second load resistor 54 combines with the current flowing from the collector 48a of the second transistor 48 to provide the second amplified signal. After the first and second amplified signals are provided to the latch stage 42 of the latch driver circuit 12, as will be described below, the first clock signal provided by the first clock circuit 58 is controlled to turn off the amplifier stage 40 and the second clock signal provided by the second clock circuit 76 is controlled to turn on the latch stage 42.

The first amplified signal (e.g., positive current value) follows the signal path denoted by the dashed line labeled as "A," which provides to the first amplified signal to the latch stage 42. More particularly, the first amplified signal is provided to the base 66b of the sixth transistor 66; through the emitter 66c of the sixth transistor 66 to the base 64b of the fifth transistor 64; through the collector 64c of the fifth transistor 64 to the base 68b of the seventh transistor 68; through the emitter 68c of the seventh transistor 68 and to the first output port 72 of the latch stage 42 and representing the first latched version (i.e., transitioned or inverted version) of the first amplified signal. Similarly, the second amplified signal (e.g., negative current value) follows the signal path denoted by the dashed line labeled as "B," which provides to the second amplified signal to the latch stage 42. More particularly, the second amplified signal is provided to the base 68b of the seventh transistor 68; through the emitter 68c of the seventh transistor 68 to the base 62b of the fourth transistor 62; through the collector 62c of the fourth transistor 62 to the base 66b of the sixth transistor 66; through the emitter 66c of the sixth transistor 66 and to the second output port 74 of the latch stage 42 and representing a second latched version (i.e., transitioned or inverted version) of the second amplified signal.

As described above, the first and second latched versions of the respective first and second amplified signals are subsequently provided to the filtering stage 44. The filtering stage 44, which in the exemplary embodiment includes a band-pass filter, filters higher order harmonics from the latched versions of the first and second amplified signals to provide the first and second LO signals having predetermined signal content, as described above. In the exemplary embodiment, the predetermined signal content in concentrated at the fundamental frequency for which the mixer 28 (FIG. 1) is adapted to optimally process the first and second LO signals. The first and second LO signals may be optionally amplified and provided to the mixer 28 or provided directly to the mixer 28 depending on any loss is signal amplitude in the first and second LO signals due to filtering. Although not specifically shown, it should be understood, that the filtering circuit may include a number of different circuit topologies (e.g., such as a tank circuit) for providing band-pass filtering or to otherwise permit only signal content associated with a fundamental frequency to pass.

In an embodiment, the latch driver circuit 12 may be implemented in silicon BiCMOS technology. In another embodiment, the latch driver circuit 12 may be implemented in CMOS technology.

Figure 3:
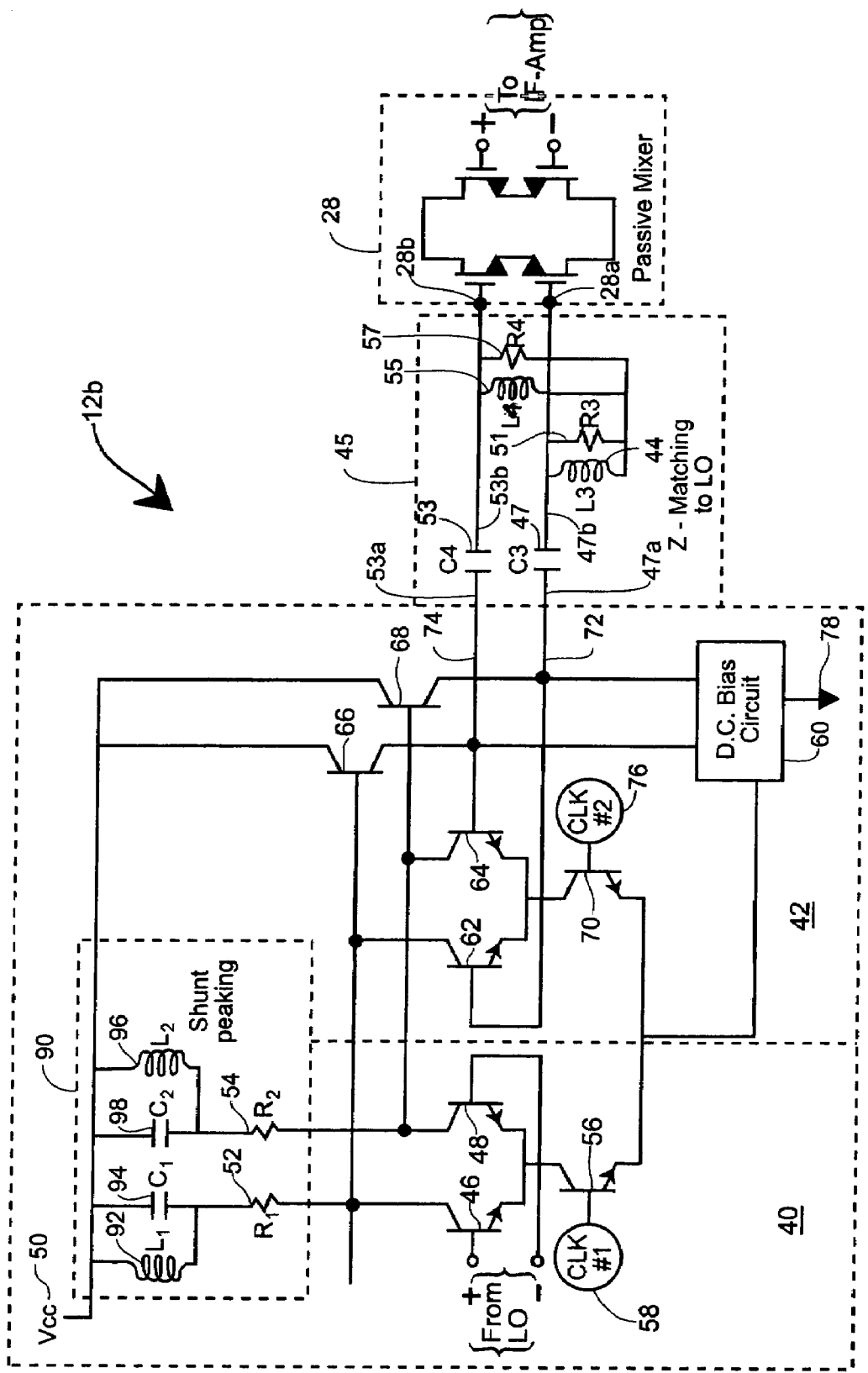
FIG. 3 is a circuit diagram of another embodiment of the latch driver circuit which may be incorporated in the RF receiver of FIG. 1.

Referring to FIG. 3, shown is another embodiment of a low power, low noise figure latch driver circuit 12b, where similar elements to that described above are provided with similar reference designations. The low power, low noise figure latch driver circuit 12b of FIG. 3 is similar to the low power, low noise figure latch driver circuit 12 of FIG. 2, however, the latch driver circuit 12b of FIG. 3 additionally includes a signal conditioning stage 90, which provides preliminary filtering and signal boosting features to the first and second amplified signals, as will be described further below. Further, the filtering stage 44 (FIG. 2) has been modified in the latch driver circuit 12b of FIG. 3 to provide a secondary filtering and impedance matching stage 45, as will also be described further below.

The signal conditioning stage 90 of the latch driver circuit 12b includes a first inductor and capacitor 92, 94 pair coupled in parallel between the supply 50 and the first load resistor 52. Similarly, the signal conditioning stage 90 of the latch driver circuit 12b further includes a second inductor and capacitor pair 96, 98 coupled in parallel between the supply 50 and the second load resistor 54. In this arrangement, each of the inductors 92, 96 provide shunt peaking features by tuning out the parasitic capacitance of the transistors located in the amplifier stage (e.g., first, second and third transistors 46, 48, 56. Also, the bandpass filtering features of the signal conditioning stage 90 incurs a loss because it is implemented using inductors 92, 96 having substantially finite Q values of approximately 10 (ten). However, the shunt peaking features of the signal conditioning stage 90 operates to substantially recover or compensate for this loss in signal. Furthermore, each of the capacitors 94, 98 of the signal conditioning stage 90 operate with each corresponding inductor 92, 96, respectively, to provide resonance at the desired operational frequency of the latch driver 12b (e.g., GHz range) and further provide preliminary filtering to the first and second amplified signals for filtering out any undesirable harmonic signal content (e.g., third, fifth, seventh . . . etc. harmonics). In one embodiment, the first inductor and capacitor pair 92, 94 may respectively include a 1.5 nH inductor and 150 fF capacitor; the second inductor and capacitor pair 96, 98 may be similarly defined; and the first and second load resistors 52, 54 may each include approximately a 337 ohm resistor.

The secondary filtering and impedance matching stage 45 includes a first capacitor 47 having a first terminal 47a coupled to the first output port 72 of the latch stage 42 and a second terminal 47b coupled to a first parallel coupled inductor and resistor pair 49, 51. The second terminal 47b of the first capacitor 47 is further coupled to a first input terminal 28a of the passive mixer 28 (e.g., positive current input terminal of the passive mixer). Similarly, the secondary filtering and impedance matching stage 45 further includes a second capacitor 53 having a first terminal 53a coupled to the second output port 74 of the latch stage 42 and a second terminal 53b coupled to a second parallel coupled inductor and resistor pair 55, 57. The second terminal 53b of the second capacitor 53 is further coupled to a second input terminal 28b of the passive mixer 28 (e.g., negative current input terminal of the passive mixer). In an embodiment, the first capacitor 47 may include an approximately 5 pF capacitor and the first parallel coupled inductor and resistor pair 49, 51 may include the approximate respective values; 1.02 nH and 153 ohms. The second capacitor 53 and the second parallel coupled inductor and resistor pair 55, 57 may include similarly defined values as the above described capacitor 47, inductor 49 and resistor 51.

In this arrangement, the secondary filtering and impedance matching stage 45 provides additional filtering to the latched versions of the first and second amplified signals, while at the same time providing a transformation in the output impedance of the latch driver circuit 12b to substantially match the input impedance of the passive driver 28 for minimizing any current reflections.

Figure 4:
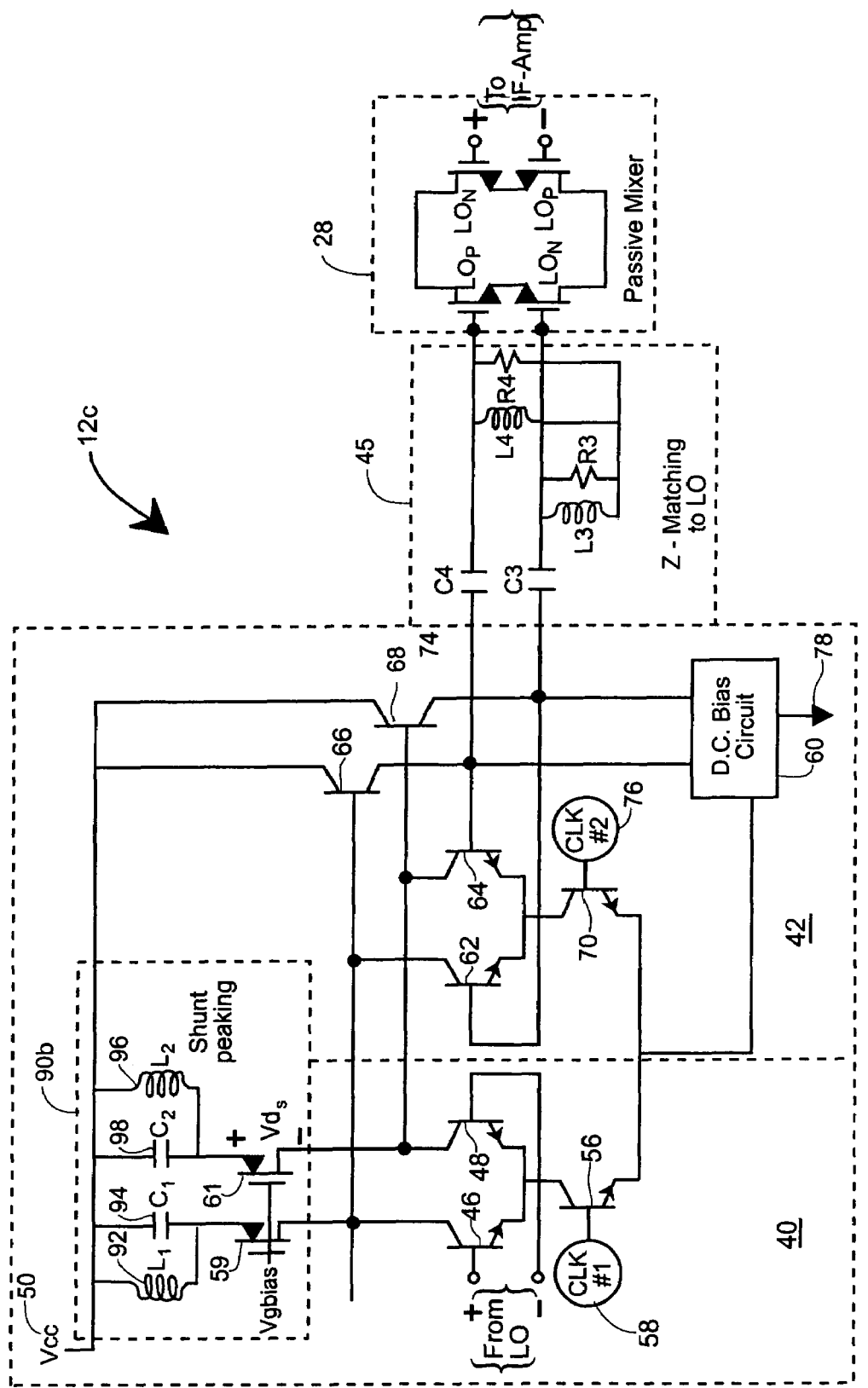
FIG. 4 is a circuit diagram of another embodiment of the latch driver circuit incorporated in the RF receiver of FIG. 1.

Referring further to FIG. 4, shown is another embodiment of the low power, low noise figure latch driver circuit 12c, where similar elements to that described above are provided with similar reference designations. The low power, low noise figure latch driver circuit 12c of FIG. 4 is similar to the low power, low noise figure latch driver circuit 12b of FIG. 3, however, the latch driver circuit 12c of FIG. 4 replaces each of the first and second load resistors 52, 54 of the signal conditioning stage 90 of FIG. 3 with respective first and second PMOS active loads 59, 61, such as MOSFETs in the signal conditioning stage 90b of FIG. 4. The first and second PMOS active loads 59, 61 operate to further reduce the overall power dissipation in the latch driver circuit 12c. The overall power dissipation in the latch driver circuit 12c may be reduced with use of the first and second PMOS active loads 59, 61 because the bias current provided by biasing circuit 60 can be reduced to operate the amplifier stage 40 of the latch driver circuit 12c in comparison to when load resistors 52, 54 (FIG. 3) are incorporated in the signal conditioning stage 90 (FIG. 3). In the exemplary embodiment, the drain-source voltage, $V_{ds}$, of the PMOS active loads 59, 61 should be maintained at approximately 1 $V_{p\text{-}p}$ through biasing of $V_{gbias}$. Similar to that described above with respect to FIG. 3, shunt peaking may be necessary to reduce the parasitic capacitance and provide a resonance at a desired operating frequency of the latch driver circuit 12c.

Figure 5:
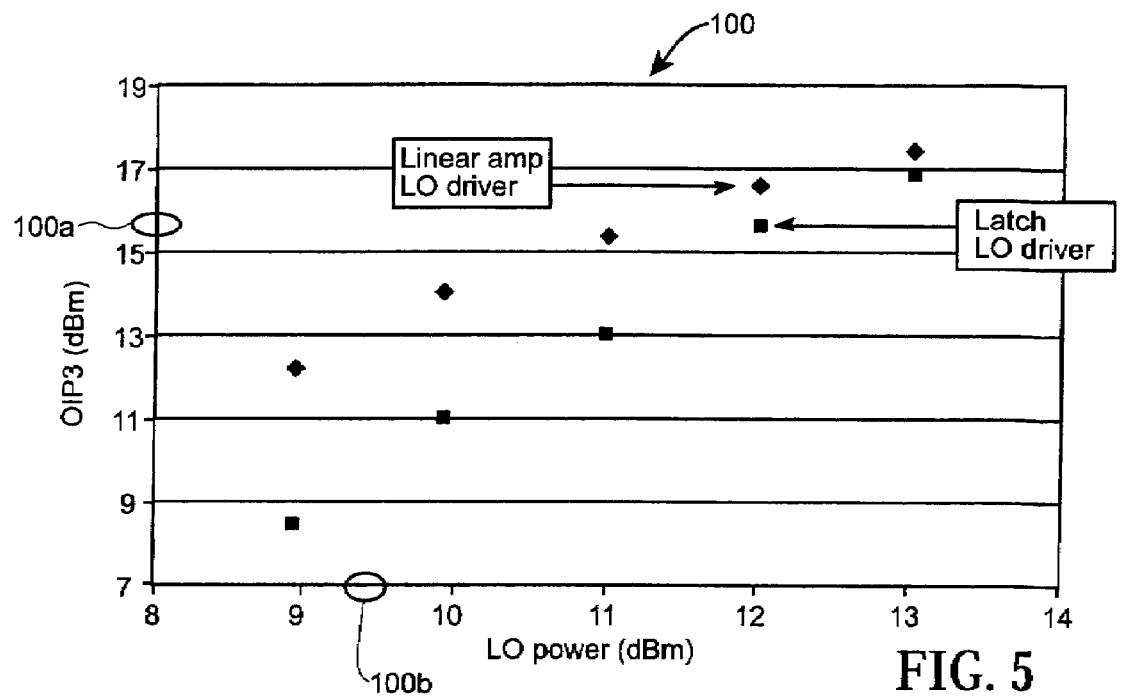
FIG. 5 is a first graph representing a comparative analysis of operational characteristics of a conventional linear amplifier and the latch driver circuit of FIG. 1.
Figure 6:
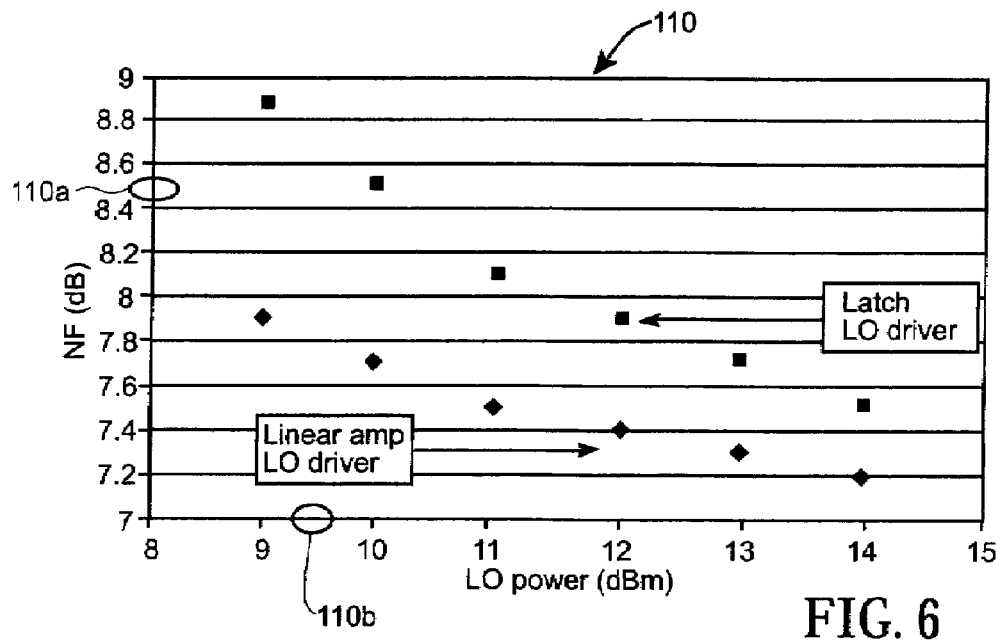
FIG. 6 is a second graph representing another comparative analysis of operational characteristics of a conventional linear amplifier and the latch driver circuit of FIG. 1.

Referring to FIGS. 5 and 6, shown are respective first and second graphs 100, 110 representing a comparative analysis between a conventional linear amplifier (not shown) being used to drive the passive mixer 28 and the latch driver circuit 12, 12b or 12c of the present invention being used to drive the passive mixer 28. The example linear amplifier and latch driver circuits 12, 12b or 12c are designed in IBM's 0.18 um SiGe BiCMOS technology. Furthermore, the example linear amplifier and latch driver circuit 12, 12b or 12c are simulated using Cadence's SpectreRF and Agilent's ADS design tools. In the first graph 100 of FIG. 5, the vertical axis 100a represents the Output Intercept Point of the third harmonic ($OIP_3$) and the horizontal axis 100b represents the power provided to the linear amplified and/or latch driver circuit 12, 12a or 12c by the local oscillator 30 (FIG. 1). In the second graph 110 of FIG. 6, the vertical axis represents the Noise Figure and the horizontal axis 110b represents the power provided to the linear amplified and/or latch driver circuit 12, 12b or 12c by the local oscillator 30 (FIG. 1).

The results of the first graph 100 of FIG. 5 illustrate that as the local oscillator power level increases beyond 12 dBm, the difference in $OIP_3$ between the two cases (e.g., linear amplifier and latch driver circuit 12, 12b or 12c) is less than 0.5 dB achieving $OIP_3 > 15$ dBm. The results of the second graph 110 of FIG. 6 illustrate that the difference in noise figure between the two cases (e.g., linear amplifier and latch driver circuit 12, 12b or 12c) is less than 0.5 dB achieving a NF<8 dB.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A driver circuit operative to drive a passive mixer located in a radio-frequency (RF) receiver, the driver circuit comprising:

a power supply;

means for biasing the driver circuit;

a differential amplifier stage coupled to the supply and the means for biasing the driver circuit and being adapted to receive first and second input signals from a local oscillator and to process the first and second input signals for providing first and second amplified signals;

a latch stage coupled to the differential amplifier stage, supply and means for biasing the driver circuit and being adapted to receive and process the first and second amplified signals for providing latched versions of the first and second amplified signals; and a filtering stage coupled to the latch stage and being adapted to receive and filter the latched versions of the first and second amplified signals for providing first and second filtered signals, wherein each of the first and second filtered signals includes predetermined signal content associated with at least one predetermined frequency range.

2. The driver circuit of claim 1, wherein the filtering stage includes a band-pass filter adapted to control the at least one predetermined frequency range to include a fundamental frequency range.

3. The driver circuit of claim 1, wherein the fundamental frequency range ranges from approximately 8 GHz to approximately 9.2 GHz.

4. The driver circuit of claim 1, wherein the filtering stage includes a tank circuit.

5. The driver circuit of claim 1, further including a signal conditioning stage coupled to the differential amplifier stage and being adapted to provide preliminary filtering to the first and second amplified signals for removing predetermined harmonic signal content from the first and second amplified signals while minimizing any signal amplitude degradation to the first and second amplified signals.

6. The driver circuit of claim 5, wherein the signal conditioning stage includes:

a first inductor and capacitor pair coupled in parallel and having first and second terminals, the first terminal of the first inductor and capacitor pair being coupled to the supply; and a first resistor having first and second terminals, the first terminal of the first resistor being coupled to the second terminal of the first inductor and capacitor pair and the second terminal of the first resistor being in a communication relationship with the first amplified signal.

7. The driver circuit of claim 6, wherein the signal conditioning stage further includes:

a second inductor and capacitor pair coupled in parallel and having first and second terminals, the first terminal of the second inductor and capacitor pair being coupled to the supply; and a second resistor having first and second terminals, the first terminal of the second resistor being coupled to the second terminal of the second inductor and capacitor pair and the second terminal of the second resistor being in a communication relationship with the second amplified signal.

8. The driver circuit of claim 5, wherein the signal conditioning stage includes:

a first inductor and capacitor pair coupled in parallel and having first and second terminals, the first terminal of the first inductor and capacitor pair being coupled to the supply; and a first transistor having a first gate, first drain and first source, the first gate being coupled to a gate biasing source, the first drain being coupled to the second terminal of the first inductor and capacitor pair and the first source being in a communication relationship with the first amplified signal.

9. The driver circuit of claim 8, wherein the signal conditioning stage further includes:

a second inductor and capacitor pair coupled in parallel and having first and second terminals, the first terminal of the second inductor and capacitor pair being coupled to the supply; and a second transistor having a second gate, second drain and second source, the second gate being coupled to the gate biasing source, the second drain being coupled to the second terminal of the second inductor and capacitor pair and the second source being in a communication relationship with the second amplified signal.

* * * * *

UNITED STATES PATENT AND TRADEMARK OFFICE
CERTIFICATE OF CORRECTION

PATENT NO.        : 7,299,028 B2
APPLICATION NO.   : 11/041183
DATED             : November 20, 2007
INVENTOR(S)       : Helen Kim Page 1 of 1

It is certified that error appears in the above-identified patent and that said Letters Patent is hereby corrected as shown below:

In the Title page, item (74), "Klouzinski" should read -- Klauzinski --.

Signed and Sealed this

Thirteenth Day of May, 2008

JON W. DUDAS
*Director of the United States Patent and Trademark Office*